United States Patent [19]

Kugelman

[11] Patent Number: 5,089,926
[45] Date of Patent: Feb. 18, 1992

[54] CURRENT MONITOR USING A DC ISOLATING AMPLIFIER CIRCUIT

[75] Inventor: Michael M. Kugelman, Akron, Ohio
[73] Assignee: B. F. Goodrich Co., Akron, Ohio
[21] Appl. No.: 531,589
[22] Filed: Jun. 1, 1990
[51] Int. Cl.$^5$ .................... G01R 19/00; G01R 19/165
[52] U.S. Cl. ....................... 361/87; 361/91; 361/56; 340/664; 340/640
[58] Field of Search .......... 361/87, 86, 56, 60, 361/91, 98; 340/664, 640; 307/39, 52, 53, 311, 570, 565

[56] References Cited

U.S. PATENT DOCUMENTS

| | | | |
|---|---|---|---|
| 4,115,828 | 9/1978 | Rowe et al. | 361/1 |
| 4,414,539 | 11/1983 | Armer | 340/500 |
| 4,943,761 | 7/1990 | Fox et al. | 323/283 |

Primary Examiner—A. D. Pellinen
Assistant Examiner—Stephen Jackson
Attorney, Agent, or Firm—Weston, Hurd, Fallon, Paisley & Howley

[57] ABSTRACT

A current monitor includes a DC isolating amplifier circuit especially adapted for adjusting the set point of a comparator. The isolating amplifier circuit includes an operational amplifier generating a first current in response to an input voltage received by the operational amplifier. The first current is transmitted to a first optocoupler and a second optocoupler which are characterized by a first CTR and a second CTR, respectively. An output of the first optocoupler is fed back to an input of the operational amplifier while an output voltage of the second optocoupler is communicated to a set point circuit. The output voltage of the second optocoupler varies as a function of the product of the input voltage of the operational amplifier and a ratio between the first CTR and the second CTR.

42 Claims, 2 Drawing Sheets

CURRENT MONITOR USING A DC ISOLATING AMPLIFIER CIRCUIT

BACKGROUND OF THE INVENTION

1. Field of the Invention

The present invention relates to a current monitoring circuit which can be used advantageously in a de-icing circuit. The current monitoring circuit employs a DC isolating amplifier circuit that permits precise and accurate conversion of a first analog signal responsive to a bus voltage to a second analog signal, which second analog signal is intended for use with a current comparing circuit over a relatively large temperature range.

2. Description of the Prior Art

The accumulation of ice on aircraft wings and other structural members in flight is a danger that is well known. As used herein, the term "structural members" is intended to refer to any aircraft surface susceptible to icing during flight, including wings, stabilizers, engine inlets, rotors, and so forth. Attempts have been made since the earliest days of flight to overcome the problem of ice accumulation. While a variety of techniques have been proposed for removing ice from aircraft during flight, these techniques have had various drawbacks that have stimulated continued research activities.

One approach that has been used is so-called thermal deicing. In thermal de-icing, the leading edges, that is, the portions of the aircraft that meet and break the airstream impinging on the aircraft, are heated to prevent the formation of ice or to loosen accumulated ice. The loosened ice is blown from the structural members by the airstream passing over the aircraft.

In one form of thermal de-icing, heating is accomplished by placing a rubber boot or electrothermal pad(s), including heating elements, over the leading edge of the aircraft, or by incorporating the heating elements into the structural members of the aircraft. Electrical energy for each heating element is derived from a generating source driven by one or more of the aircraft engines. The electrical energy is intermittently or continuously supplied to provide heat sufficient to loosen accumulating ice.

When using electrothermal pads to achieve de-icing, the pads are preferably heated intermittently. By operating the pads intermittently, and sequencing the operation of the pads so that relatively few of the pads are operated during any particular time period, the power required to support the de-icer is significantly reduced.

To operate the pads sequentially, time-sequencers are typically employed in conjunction with an electrical source. Such timer sequencers or timer controllers are adapted to sequentially apply current for desired time intervals to various pads mounted on a structural member of an aircraft. That is, when used with aircraft, these de-icing pads function as electrical loads operatively coupled to the aircraft bus. Loss of an electrical load results in a drop of current delivered to the load, i.e. a drop in load current. As discussed in U.S. Pat. No. 4,814,931 to Kugelman et al. ("'931 patent"), timer-controllers have been utilized with measuring or indicating means for informing operating personnel when the amount of load current flowing through the aircraft bus has dropped below an acceptable level.

In the current comparing arrangement of '931 patent, a voltage, representative of load current, is determined from an aircraft bus using a shunt. This representative voltage is transmitted to a comparator and compared with a high reference voltage and a low reference voltage. The reference voltages are developed as a result of adjusting the set point of the comparator. During operation, the representative voltage is compared with the reference voltages, and if, for example, the representative voltage falls below the low reference voltage, the comparator sends an activating signal to a lamp, or a like indicating device. This technique is quite effective as long as the voltage of the bus remains stable. In particular, as long as the bus voltage is relatively steady, any significant drops in load current can be attributed to a loss in one or more of the de-icing loads.

On the other hand, for the condition in which either the bus voltage can drop or a de-icing load can be lost, the above-described current monitoring technique is deficient. Since the load current will drop when either the bus voltage drops or a de-icing load is lost, the cause of drop in load current cannot be specifically determined from a comparing arrangement such as that in the '931 patent. Desirably, a current monitor would be available that would indicate a drop in load current due to a loss in de-icing load rather than to a decrease in bus voltage.

SUMMARY OF THE INVENTION

In response to the foregoing concerns, the present invention provides a current monitor employing a DC isolating amplifier circuit, the DC isolating amplifier circuit is especially suited for adjusting a set point circuit of a comparator. The isolating amplifier circuit includes an amplifier for generating a first current which varies as a function of the input of a voltage, such as a bus voltage. The isolating amplifier circuit also includes a signal generator and first and second signal detectors. In the preferred embodiment, the signal generator and the first and second signal detectors are in the form of first and second optocouplers. The first current is transmitted to the first optocoupler and the second optocoupler which are characterized by a first current transfer ratio (CTR) and a second CTR, respectively. An output of the first optocoupler is fed back to an input of the amplifier while an output voltage of the second optocoupler is communicated to the set point circuit of the comparator. The output voltage of the second optocoupler is responsive to the product of both the bus voltage and a ratio between the first CTR and the second CTR.

In the preferred embodiment, the set point circuit is connected to the output of the second optocoupler for generating at least one reference voltage, which reference voltage varies in response to changes in the bus voltage. A load current converting circuit is coupled to the bus for converting the load current into a voltage representative of the load current ("representative voltage"). The load current converting circuit includes shunting means operably connected to the bus for developing a voltage differential, and a second amplifier is used to amplify the voltage differential to generate the representative voltage.

The comparator is employed to compare the reference voltage with the representative voltage. Since the reference voltage is normalized to account for bus voltage fluctuation, any drop in the representative voltage can be attributed to a loss in load.

Numerous advantages of the present invention will be appreciated by those skilled in the art.

One advantage of the present invention is that it makes the set point circuit, and thus the comparator responsive to changes in the bus voltage, so that the current comparing circuit can be used as a resistance monitor. That is, since the set point circuit varies with the bus, a signal from the comparator indicating that load current has dropped to an undesirable level is only triggered by a change in load resistance or load drops.

Another advantage of the present invention is that it uses two optocouplers in an amplifying circuit to facilitate desirable operation of the comparing arrangement over a relatively large range of temperatures. More particularly, one detector is used on a first level, having a first circuit common as its reference, and a second detector is used on a second level having a second circuit common as its reference so that deviation of the CTR due to temperature on the first level is substantially cancelled out by the deviation of the CTR due to temperature on the second level. This off-setting or cancellation of temperature influence is important in aircraft applications in which the range of temperature encountered during operation may be considerable.

Yet another advantage of the present invention is that it is easy to manufacture and is economical. The components used to build the circuit are readily available and the circuit is relatively easy to build. Additionally, commonly available, inexpensive components, which are typically found in so-called dual inline packages (DIPs) are used to construct the circuit. For example, the comparator and the DC isolating amplifier can be built with one quad DIP of operational amplifiers and the first and second optocouplers can be built from one DIP.

Yet another advantage of the present invention is that it is highly predictable and promotes linear operation. Therefore, it is easy to manufacture within desired specifications and maintain. Additionally, linear conversion of the first analog signal to the second analog signal is facilitated by the topology of the voltage booster so the output voltage communicated to the set point circuit is consistently maintained at a predetermined level above the bus voltage.

Yet another advantage of the present invention is that it readily imparts information to operating personnel without the need to read measuring devices and/or make corresponding calculations. Consequently, the need for maintaining measuring devices, such as ammeters at the control board, is virtually eliminated. With the present arrangement, a lamp can be advantageously disposed on or near the control board so that the lamp is lit up by a signal from the comparator means designating that a load has been lost.

Another advantage of the present invention is that it allows for the detecting of load loss on the high side of the bus. Detection on the high side of the bus makes implementation of the current monitor far more convenient. When measuring the load current on the high side of the bus, there is no need to return a line from the low end of the load to the control board.

These and other features, advantages and objects of the present invention will be further understood and appreciated by those skilled in the art by reference to the following written specification, claims and appended drawings.

DESCRIPTION OF THE PREFERRED EMBODIMENT

Figure 1:
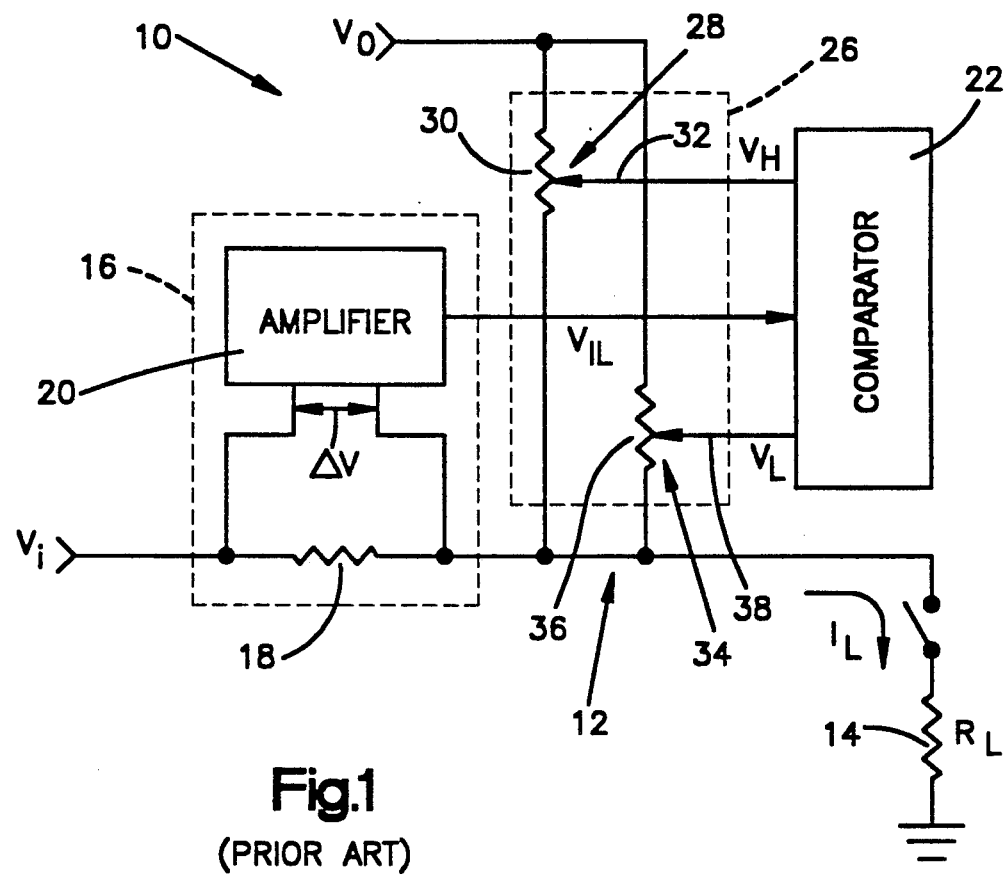
FIG. 1 is a schematic representation of a circuit, partly in block diagrammatic form, showing a prior art implementation for measuring load current with respect to preset reference voltages.

FIG. 1 illustrates part of a current monitor 10 typically used in a timer-sequencer of a thermal de-icer. The circuit 10 includes a bus 12 which is characterized by a $V_I$ and is coupled to a plurality of loads 14, only one of which is shown for convenience. A load current, $I_L$, is selectively transmitted to the load $R_L$ by, for example, a relay 15. To determine the magnitude of $I_L$ of bus 12, a load current converting circuit 16 is employed. The load current converting circuit 16 includes a shunting resistor 18 which has a very small resistance, and an amplifier 20. The amplifier 20 is connected to an input of comparator 22, which comparator 22, along with the amplifier 20, has its common connected to the bus 12.

Reference voltages are developed for use with the comparator 22 by way of set point circuit 26. A high reference voltage, $V_H$, is developed at potentiometer 28; the potentiometer 28 includes resistor 30 and wiper 32. A low reference Voltage, $V_L$, is developed at potentiometer 34; the potentiometer 34 includes resistor 36 and wiper 38. Both $V_H$ and $V_L$ are set between magnitudes of $V_I$ and $V_o$ by appropriately setting the wipers 32,38 of potentiometers 28,34.

In operation, $V_I$ is established and a voltage representative of $I_L$, i.e. $V_{IL}$, is developed by amplifying a small voltage differential generated across the shunting resistor 18, and by communicating $V_{IL}$ to an input of comparator 22. The magnitude of $I_L$, and thus $V_{IL}$, can drop in response to a decrease in $V_I$ as well as to a loss of load 14. When the magnitude of $V_{IL}$ drops below the magnitude of $V_L$, the comparator 22 transmits a signal indicating as much. With the arrangement of FIG. 1, $V_o$ is fixed so that set point circuit 26 does not accommodate fluctuations in $V_I$. Without this accommodation, however, there is no way to determine whether the drop in $I_L$ is due to a drop in $V_I$ or a loss of load 14.

Figure 2:
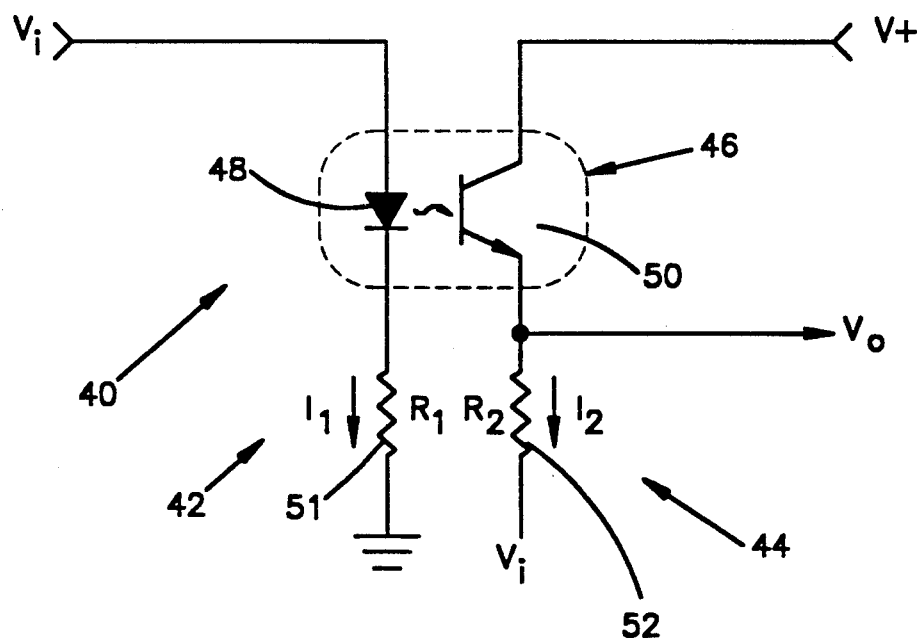
FIG. 2 is a schematic representation of a circuit used with the circuit of FIG. 1 in which an isolating amplifier is employed to convert a first analog signal referenced to a first circuit common to a second analog signal referenced to a second circuit common.

A solution to the above-presented problem could be achieved by varying $V_o$ in response to changes in $V_I$ to essentially normalize $V_L$ and $V_H$ for changes in $V_I$. It has been further recognized by the inventor that such normalization could be achieved through use of an isolation amplifier. Referring to FIG. 2, an isolation amplifier 40, as it can be used in the current monitor 10, is shown. As will be appreciated by those skilled in the art, isolation amplifiers are useful for converting an analog signal that is referenced to one voltage to another analog signal that is referenced to a different voltage.

The arrangement of FIG. 2 includes a first level 42 corresponding to circuitry referenced to a first circuit common and a second level 44 corresponding to circuitry referenced to a second circuit common mode, such as a bus. The isolation amplifier 40 includes an optocoupler 46 having a light emitting diode (LED) 48 operatively coupled with a light detecting transistor 50. On first level 42, $V_I$ is divided between the LED 48, as $V_D$, and the resistor 51, having a resistance of $R_1$. On second level 44, the light detecting transistor 50 has a collector connected to a supply voltage V+ and an emitter grounded to the second circuit common by way of resistor 52 having a resistance of $R_2$. Additionally, $V_o$ is tapped off the high end of resistor 52 while currents $I_1$ and $I_2$ are transmitted through resistors 50 and 52, respectively. Finally, as a result of the property of optocoupler 46, the current $I_2$ is expressed as follows:

$$I_2 = cI_1$$

where c is a current transfer ratio associated with the optocoupler 46; the current transfer ratio representing the ability of the optocoupler 46 to transfer $I_1$ to the output of the optocoupler 46 and varying, in some cases, as a function of temperature.

The following calculations illustrate the relationship between $V_o$ and the parameters of levels 42, 44 discussed thus far:

$$I_1 = (V_I - V_D)/R_1 \quad (1)$$

$$I_2 = cI_1 \quad (2)$$

$$V_o = I_2 R_2 \quad (3)$$

Substituting Equation (2) into Equation (3):

$$V_o = cI_1 R_2 \quad (4)$$

Substituting Equation (1) into Equation (4):

$$V_o = [c(V_I - V_D)R_2]/R_1 \quad (5)$$

If $R_1 = R_2$ then:

$$V_o = c(V_I - V_D) \quad (6)$$

As illustrated by the above calculations, when using isolation amplifier 40, $V_o$ can vary in response to changes in c, $V_I$ and $V_D$. While the purpose of the circuit of FIG. 2 is to provide an arrangement that varies in response to changes in $V_I$, changes in c and $V_D$ are undesirable. Indeed, c and $V_D$ do change from device to device and in response to changes in temperature.

While drastic temperature changes are not encountered in all arrangements employing optocouplers, any de-icing arrangement using an optocoupler would inevitably be subjected to substantial amounts of error as a result of temperature-dependent fluctuations in c and $V_D$. As can be appreciated, a significant range of fluctuation in temperature would make any system using the isolation amplifier 40 unpredictable. That is, even if the variability of the c term could be trimmed out of the current monitor 10 for each device, the temperature dependence of c would still cause the circuit 10 to deviate undesirably from the ideal over just about any significant temperature range encountered.

Figure 3:
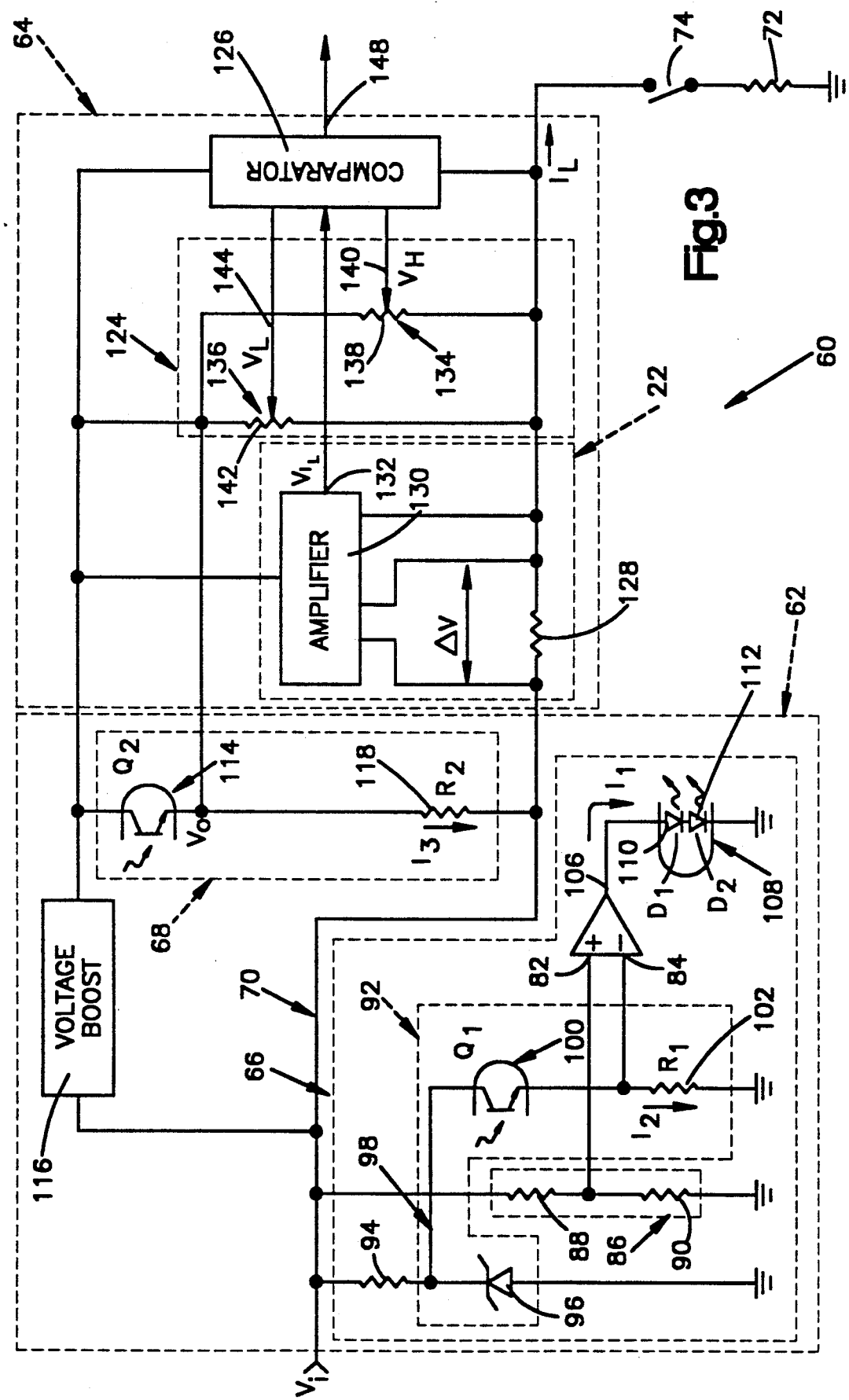
FIG. 3 is a schematic representation of a circuit, partly in block diagrammatic form, of the current monitor embodying the present invention.

To accomplish one of the goals of the present invention, namely, to make $V_o$ responsive to $V_I$ without requiring adjustment for different values of c and without generating temperature-related error, certain modifications are required in the circuitry of current monitor 10 and isolation amplifier 40. Referring to FIG. 3, a current monitor that makes the necessary modifications to accomplish the above-mentioned goal is indicated by the reference numeral 60.

The current monitor 60 includes a DC isolating amplifier circuit 62 coupled with a current comparing circuit 64. The isolating amplifier circuit 62 is divided into a first level 66 and a second level 68, both of which levels 66, 68 are coupled to a bus 70. As is conventional, bus 70 services many peripherals, only a few of which are shown in FIG. 3. The bus 70 is operatively connected to a plurality of loads 72, one of which is shown for convenience in FIG. 3. In one example, each of the loads 72 is connected to the bus 70 by way of a switch or relay 74 which is closed during the interval in which heating of load 72 is desired. In the preferred embodiment, $V_I$ is maintained between a range of 18-32 VDC, and more particularly is about 28 VDC.

The high end of the bus 70 serves as an input for amplifier 78, which amplifier 78, in the preferred embodiment, is an operational amplifier having a non-inverting input 82 and an inverting input 84. The non-inverting input 82 is coupled to the bus 70 by way of a voltage dividing circuit 86 having resistors 88 and 90. As is common with voltage dividing circuits, the resistances of resistors 88, 90 are set to determine the input voltage at the non-inverting input 82. In the present example, this input voltage is set at about $V_I/4$ to correspond with the "rails" or supply voltage requirements of the operational amplifier 78.

The inverting input 84 of the operational amplifier 78 is coupled with the bus 70 by way of a voltage regulating-feedback circuit 92, which circuit 92 is connected to the bus 70 by way of a resistor 94. Voltage regulation is achieved through use of a zener diode 96, thereby assuring that the voltage of the inverting input 84 cannot exceed a predetermined voltage, which in the present example is 12 VDC. The regulated voltage is divided across a branch 98 that includes a first signal or light detector 100, the significance of which will be discussed in further detail below, and a resistor 102 having a resistance of $R_1$.

The operational amplifier 78 has an output 106 from which a current $I_1$ is transmitted. A current $I_2$ is transmitted through resistor 102 in response to input from $V_I$. $I_1$ is transmitted to signal generator 108. In the preferred embodiment, the signal generator 108 is a light emitter including a single light emitting diode (LED) responsive to $I_1$. For the convenience of manufacturing, the light emitter 108 includes a first LED 110 and a second LED 112. It will be appreciated by those skilled in the art that the type of light used to implement the DC isolating amplifier 62 covers a broad spectrum of light and is not limited to visible light. Indeed, the type of LEDs used with the DC isolating amplifier 62 are adapted to generate electromagnetic waves having wavelengths that are considerably less than that of visible light.

The first LED 110 and second LED 112 are optically coupled to first light detector 100 and a second signal or light detector 114, respectively. In the preferred embodiment, each of the light detectors 100, 114 includes a light-detecting transistor having an input, or collector, as well as an output, or emitter. The LEDs 110, 112 and the light detectors 100, 114 preferably are disposed on a DIP, such as a phototransistor optocoupler made by General Instrument (MCT6 series).

While, in the preferred embodiment, the type of signal generated by signal generator 108 is light, it will be appreciated that other signal types could be used to implement the DC isolating amplifier circuit 62. For example, it is contemplated that the DC isolating amplifier 62 could be implemented with an arrangement of transducers that generate and detect sound.

Referring again to FIG. 3, it can be recognized that a $V_D$ term is generated by the LEDs 110, 112. As mentioned above, temperature variation in VD can generate undesirable error in an isolating amplifier. Use of a negative feedback loop, including the light detector 100 "servos out" or minimizes the effect of $V_D$ on the DC isolating amplifier circuit 62. In particular, the operational amplifier 78 compensates its current output for changes in $V_D$, which changes are reflected in the feedback from the light detector 100.

As further illustrated in FIG. 3, the collector of the second light detector 114 is connected to an output of a voltage booster 116 and the emitter of the second light detector 114 is grounded to the bus 70 by way of a resistor 118, having a resistance $R_2$ and across which a current, designated $I_3$, is transmitted. While the voltage booster 116 plays an important role in the operation of both the DC isolating amplifier circuit 62 and the current comparing circuit 64, the circuitry for implementing the voltage booster 116 is conventional, and is therefore not shown in FIG. 3.

Additionally, as with the optocoupler 40 in FIG. 2, $V_o$ is tapped off the emitter of the second light detector 114, and, as explained in further detail below, the output of second light detector 114, i.e. $V_o$, is employed to greatly enhance the operation of comparing circuit 64.

Referring to the first level 66 in FIG. 3, when operational amplifier 78 is operating in its linear range, the voltages measured at the inputs 82, 84 are substantially equal. Thus:

$$V_J = I_2 R_1 \quad (1)$$

where $V_J$ is proportional to $V_I$ by a constant K, which constant K depends on the resistances set for resistors 88, 90.

Since he output of the first light detector 100 is connected to the high end of resistor 102:

$$I_2 = c_1 I_1 \quad (2)$$

where $c_1$ is the first current transfer ratio (first CTR) of optocoupled first LED 110 and first light detector 100.

Substitute Equation (2) into Equation (1):

$$V_J = c_1 I_1 R_1$$

$$\text{or } I_1 = V_1/(c_1 R_1) \quad (3)$$

Referring to the second level 68:

$$V_o = I_3 R_2 \quad (4)$$

Since the output of the second light detector 114 is connected to the high end of the resistor 118:

$$I_3 = c_2 I_1 \quad (5)$$

where $c_2$ is the second current transfer ratio (second CTR) of optocoupled second LED 112 and the second light detector 114.

Substituting Equation (5) into Equation (4):

$$V_o = c_2 I_1 R_2 \quad (6)$$

Substituting Equation (3) into Equation (6):

$$V_o = (c_2 V_J R_2)/(c_1 R_1)$$

when $R_1 = R_2$:

$$V_o = (c_2/c_1) V_J \quad (7)$$

or $$V_o = K(c_2/c_1) V_J \quad (8)$$

where K is a constant defined above with Equation (1).

Referring to Equation 8 of the above calculations, it will be noted that $V_o$ varies with $V_I$ as a function of the ratio between the second CTR and the first CTR. Gain of the DC isolating amplifier 62 is set by the ratio of $R_1$ and $R_2$ and when $R_1 = R_2$, the transfer function of the DC isolating amplifier circuit 62 is $K(c_2/c_1)$. For those temperature ranges in which the optocoupled first LED 110 and the first light detector 100 as well as the optocoupled second LED 112 and the second light detector 114 possess similar operating specifications, the ratio $c_2/c_1$ is constant.

It should be appreciated that $c_2$ is divided by $c_1$ in Equation 8 because the light detectors 100, 114 are disposed opposite to one another in first level 66 and second level 68, respectively. That is, the first CTR is associated with $V_1$ and the second CTR is associated with $V_o$. Consequently, the temperature-related error of $c_2$ is effectively offset by the temperature-related error of $c_1$. Moreover, due to the construction of DC isolating amplifier circuit 62, in which the first CTR and the second CTR are disposed on the same DIP this offset in the ratio $c_2/c_1$ is achieved for a substantial portion of the operating range of DC isolating amplifier circuit 62. Finally, as mentioned above, the effects of $V_D$ are minimized by the use of the negative feedback loop coupled with the operational amplifier 78.

Referring still to FIG. 3, the comparing circuit 64 includes a load current converting circuit 122, a set point circuit 124 and comparator 126. Load current converting circuit 122 includes a shunting device or resistor 128 having its high end and low end coupled with a second amplifier 130. In the preferred embodiment, the shunting resistor 128 is as small as possible, so that only a negligible amount of the load current $I_L$ is removed from the bus 70 by the load current converting circuit 122. As will be appreciated by those skilled in the art, the shunting device 128 could also be implemented with other elements capable of developing a voltage differential proportional to $I_L$. The second amplifier 130 has an output 132, which output 132 is adapted to communicate a voltage, $V_{IL}$, substantially corresponding to $I_L$, to an input of the comparator 126. In the preferred embodiment, a high end of the second amplifier 130 is boosted about 14 volts above $V_I$ by way of the voltage booster 116. An example of a circuit implementation for current converting circuit 122 and comparator 126 can be found in U.S. Pat. No. 4,814,931 to Kugelman et al.

Set point circuit 124 includes a first potentiometer 134 and a second potentiometer 136. The first potentiometer 134 includes a resistor 138 and a wiper 140, while the second potentiometer 136 includes a resistor 142 and a Wiper 144. The implementation of set point circuit 124 and comparator 126 is notable in at least two major respects. First, the high end of comparator 126 is boosted above $V_I$, 14 VDC in one example, so that the range of comparison for comparator 126 is optimized.

Second, and probably most significantly, the high ends of resistors 138, 142 are interconnected with the emitter of the second light detector 114 so that the set point circuit 124 is responsive to changes in $V_I$. With these exceptions in mind, the components of the set point circuit 124 and the comparator 126 could be implemented in the same way as shown in FIGS. 1A and 1B of the '931 patent. A comparator output 148 of the comparator 126 is connected to an indicating device (not shown) or the like.

In the preferred form of operation, the DC isolating amplifying circuit 62 is constructed so that $V_o$ is substantially equal to (5/4) $V_I$. Moreover, wipers 140, 144 are adjusted so that high and low reference voltages, $V_H$ and $V_L$, can be achieved within desired ranges as $V_o$ is varied. Once switch 74 is closed, $I_L$, which in the preferred embodiment can range from 10-50 amps is delivered to load 72. As IL is transmitted through the shunting resistor 18, a voltage differential, V, is developed. In turn, V is amplified by the second amplifier 130 to $V_{IL}$ and is transmitted across output 132 to the comparator 126.

The transmitted magnitude of $V_{IL}$ then is compared to $V_H$ and $V_L$ and, if $V_{IL}$ is outside of the range defined by $V_H$ and $V_L$, then a signal is transmitted from the comparator 126 to the indicating device to inform operating personnel of an undesirable increase or decrease in $I_L$. In the preferred embodiment, the indicating device is a lamp that lights in response to the signal transmitted from the comparator output 148. As will be appreciated, a loss in load 72 will result in a drop of $V_{IL}$ below $V_L$, which in turn will cause the lamp to light. On the other hand, comparator output 148 will not be sent just because $I_L$ rises or drops in response to acceptable fluctuations in $V_I$.

A simple, yet effective arrangement for monitoring resistive elements or loads connected to a bus has been described. The arrangement includes a DC isolating amplifier that can be employed advantageously over a wide temperature range with little error. Moreover, the amplifier is well adapted to translate the bus voltage to an elevated voltage output. By employing the elevated voltage output of the DC isolating amplifier to vary the set point means of a current comparing circuit, ambiguities typically associated with measuring loads virtually are eliminated.

In the foregoing description, it will be readily appreciated by those skilled in the art that modifications may be made to the invention without departing from the concepts disclosed herein. Such modifications are to be considered as included in the following claims unless those claims, by their language, expressly state otherwise.

What is claimed is:

1. A DC isolating amplifier circuit, comprising:
   an amplifier, the amplifier generating a first current in response to receiving an input voltage;
   a signal generator connected to the amplifier, the signal generator generating a signal, the signal varying as a function of the first current;
   a first signal detector, the first signal detector detecting the signal generated by the signal generator, the first signal detector including means for generating a second current, the second current varying as a function of the signal generated by the signal generator, the ratio of the second current to the first current defining a first current transfer ratio (CTR);
   a second signal detector for detecting the signal generated by the signal generator, the second signal detector including means for generating an output voltage and a third current, the third current varying as a function of the signal generated by the signal generator, the ratio of the third current to the first current defining a second CTR; and
   wherein the output voltage is a function of the product of the input voltage received by the amplifier and the ratio of the first CTR to the second CTR.

2. The DC isolating amplifier circuit of claim 1, wherein the signal generator is a light emitter, and wherein the first signal detector and the second signal detector ar light detectors.

3. The DC isolating amplifier circuit of claim 1, wherein the amplifier is an operational amplifier having an inverting input and a non-inverting input.

4. The DC isolating amplifier circuit of claim 2, wherein the first light detector has an output and the amplifier has at least one input, and wherein the output of the first light detector is connected to the input of the amplifier.

5. The DC isolating amplifier circuit of claim 4, wherein the amplifier is an operational amplifier having an inverting input and a non-inverting input, and wherein the output of the first light detector is connected to the inverting input of the operational amplifier.

6. The DC isolating amplifier circuit of claim 1, wherein:
   the amplifier is operatively connected to a bus having a bus voltage, and the amplifier has at least one input; and
   the amplifier includes a voltage divider, the voltage divider dividing the bus voltage into a plurality of voltages, one of which voltages is communicated to the input of the amplifier.

7. The DC isolating amplifier circuit of claim 1, wherein the amplifier is operatively coupled to a bus having a bus voltage and the amplifier has at least one input; and
   the amplifier includes means for regulating the extent to which the bus voltage is communicated to the input of the amplifier.

8. The DC isolating amplifier circuit of claim 2, wherein the light emitter includes a first LED and a second LED, and wherein the first LED is connected in series with the second LED.

9. The DC isolating amplifier circuit of claim 1, wherein the ratio of the first CTR and the second CTR is substantially constant over a predetermined temperature range.

10. The DC isolating amplifier circuit of claim 9, wherein the predetermined temperature range is approximately $-55°$ C. to $70°$ C.

11. The DC isolating amplifier circuit of claim 2, wherein the light emitter as well as the first light detector and the second light detector are disposed in a dual-in-line package.

12. The DC isolating amplifier circuit of claim 1, wherein:
   the amplifier includes at least one input coupled to a first circuit common by way of a first resistor having a first resistance;
   the second light detector has an output and the output is coupled to a second circuit common by way of a second resistor having a second resistance; and the DC isolating amplifier circuit has a gain and the gain varies as a function of the ratio of the first resistance and the second resistance.

13. The DC isolating amplifier circuit of claim 12, wherein:
the magnitude of the first resistance is substantially equal to the magnitude of the second resistance; and
the output voltage is substantially equal to the product of the input voltage received by the amplifier and the ratio between the first CTR and the second CTR.

14. A current monitor especially adapted for detecting a drop in load current of a bus, the bus having a voltage, the current monitor comprising:
an amplifier, the amplifier generating a current, the current varying as a function of the voltage of the bus;
a signal generator being connected to the amplifier, the signal generator generating a signal varying as a function of the current generated by the amplifier;
a signal detector being operatively coupled to the the signal generator, the signal detector detecting the signal transmitted from the signal generator, and the signal detector generating an output current, the output current varying as a function of the voltage of the bus;
a set point circuit operatively connected to the signal detector, the set point circuit generating a reference voltage, and the reference voltage varying as a function the output of the signal detector;
a comparator, the comparator comparing the reference voltage with a voltage substantially corresponding to the load current; and
whereby a loss in load results in a drop in load current with respect to the reference voltage.

15. The current monitor of claim 14, further comprising a load current converting circuit, the load current converting circuit being coupled with the bus, and the load current converting circuit converting the load current into the voltage substantially representative of the load current.

16. The current monitor of claim 15, wherein the load current converting circuit includes:
shunting means operatively connected to the bus for shunting the load current, the shunting means having the capacity to develop a voltage differential responsive to the load current; and
a second amplifier connected to the shunting means, the second amplifier amplifying the voltage differential, and the amplified voltage differential being substantially equal to the voltage substantially representative of the load current.

17. The current monitor of claim 14, wherein the signal generator in combination with the signal detector defines a first optocoupler having a first CTR.

18. The current monitor of claim 17, wherein the first optocoupler has an output, and wherein the output of the first optocoupler is coupled with the amplifier.

19. The current monitor of claim 17, further comprising a second optocoupler having a second CTR, and wherein the reference voltage varies as a function of the product of the bus voltage and the ratio between the first CTR and the second CTR.

20. The current monitor of claim 19, wherein the second optocoupler has an output, and wherein the output of the second optocoupler is operatively connected to the set point circuit.

21. The current monitor of claim 14, wherein the set point circuit includes a potentiometer, and wherein the potentiometer develops the reference voltage.

22. The current monitor of claim 21, wherein the potentiometer includes a resistor over which the reference voltage is developed, and wherein the potentiometer includes a wiper operatively interconnecting the comparator with the resistor.

23. The current monitor of claim 19, wherein the second optocoupler includes a light detector, wherein the light detector has a high end, wherein the comparing circuit further includes a voltage booster, wherein the voltage booster interconnects the bus with the high end of the light detector, and wherein the voltage booster raises the voltage at the high end of the light detector to a magnitude that is greater than that of the voltage of the bus.

24. The current monitor of claim 23, wherein the voltage at the high end of the light detector is about 14 volts higher than the voltage of the bus.

25. The current monitor of claim 23, wherein the light detector includes a low end, and wherein the low end of the second light detector is operatively grounded to the bus.

26. The current monitor of claim 14, wherein the comparator includes a state indicating output which is disposed in one of a high state and a low state when the voltage substantially representative of the load current assumes a magnitude that is less than the magnitude of the reference voltage.

27. A method for amplifying a first analog signal being referenced to a first circuit common to a second analog signal being referenced to a second circuit common, the method comprising the steps of:
generating a first current in response to a first voltage;
providing a first signal detector and a second signal detector;
generating a signal, the signal varying as a function of the first current;
transmitting the signal to both the first signal detector and the second signal detector;
generating a second current using the first signal detector, the second current varying as a function of the signal transmitted to the first signal detector, and the ratio of the second current to the first current defining a first CTR;
generating a third current and an output voltage using the second signal detector, the third current varying as a function of the signal transmitted to the second signal detector, and the ratio of the third current to the first current defining a second CTR; and
wherein the output of the second signal detector varies as a function of the product of the input voltage of the amplifier and the ratio between the first CTR and the second CTR.

28. The method of claim 27, wherein the method further comprises the steps of providing a light emitter and generating the signal using the light emitter, and wherein the first signal detector and the second signal detector are light detectors.

29. The method of claim 28, wherein the step of generating a first current includes providing an amplifier having an input and using the amplifier to generate the first current, wherein the first light detector has an output, and wherein the second current is transmitted from the output of the first light detector to the input of the amplifier.

30. The method of claim 27, wherein the ratio of the first CTR and the second CTR is substantially constant over a predetermined temperature range.

31. A method for detecting a drop in load current of a bus, the bus having a voltage, the method comprising the steps of:
generating a first current, the current varying as a function of the voltage of the bus;
generating a signal, the signal varying as a function of the first current;
providing a signal detector;
transmitting the signal to the signal detector;
detecting the signal using the signal detector, the signal detector generating an output current varying as a function of the voltage of the bus;
providing a set point circuit; and
varying the set point of the set point circuit in response to changes in the output current of the signal detector.

32. The method of claim 31, wherein the step of generating the first current includes providing an amplifier and generating the first current using the amplifier.

33. The method of claim 31, further comprising the steps of:
providing a comparator;
generating a reference voltage using the output current of the signal detector; and
comparing the reference voltage with a voltage substantially representative of the load current.

34. The method of claim 33, further comprising the steps of:
providing a load current converting circuit; and
converting the load current into the voltage substantially representative of the load current.

35. The method of claim 34, wherein the step of converting the load current into the voltage substantially representative of the load current, further comprises the steps of:
providing shunting means operatively connected to the bus;
developing a voltage differential responsive to the load current using the shunting means;
providing a second amplifier; and
amplifying the voltage differential using the second amplifier to achieve the voltage substantially representative of the load current.

36. The method of claim 32, wherein the method of generating the signal includes providing a signal generator and using the signal generator to generate the signal, and wherein the signal generator in combination with the signal detector is a first optocoupler having a first CTR.

37. The method of claim 36, wherein the first optocoupler has an output and wherein the output of the first optocoupler is operatively connected with the amplifier.

38. The method of claim 36, further comprising the step of:
providing a second optocoupler having a second CTR, the reference voltage varying as a function of the product of the bus voltage and the ratio between the first CTR and the second CTR.

39. The method of claim 38, wherein the second optocoupler has an output, and wherein the output of the second optocoupler is operatively connected to the set point circuit.

40. The method of claim 38, wherein the second optocoupler includes a light detector, wherein the light detector has a high end, and wherein the method further includes the steps of:
providing a voltage booster, the voltage booster interconnecting the bus with the high end of the second light detector; and
raising the voltage at the high end of the second light detector to a magnitude that is greater than that of the bus.

41. The method of claim 40, wherein the voltage at the high end of the second light detector is approximately 14 volts greater than that of the voltage of the bus.

42. The method of claim 31, wherein the step of comparing the reference voltage includes:
providing a comparator having a state indicating output; and
disposing the state indicating output in one of a high state and a low state when the voltage substantially corresponding to the load current assumes a magnitude that is less than the magnitude of the reference voltage.

* * * * *